United States Patent
Joo et al.

(10) Patent No.: US 9,991,017 B2
(45) Date of Patent: Jun. 5, 2018

(54) METHOD OF FORMING AMORPHOUS CARBON MONOLAYER AND ELECTRONIC DEVICE INCLUDING AMORPHOUS CARBON MONOLAYER

(71) Applicant: SAMSUNG ELECTRONICS CO., LTD., Suwon-si (KR)

(72) Inventors: Wonjae Joo, Seongnam-si (KR); Unjeong Kim, Osan-si (KR); Sungwoo Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 14/714,902

(22) Filed: May 18, 2015

(65) Prior Publication Data

US 2016/0111180 A1    Apr. 21, 2016

(30) Foreign Application Priority Data

Oct. 16, 2014 (KR) .................. 10-2014-0140165

(51) Int. Cl.
*H01B 1/04* (2006.01)
*H01L 29/786* (2006.01)
(Continued)

(52) U.S. Cl.
CPC .............. *H01B 1/04* (2013.01); *C01B 32/186* (2017.08); *C23C 16/26* (2013.01);
(Continued)

(58) Field of Classification Search
CPC ....... H01B 1/04; C01B 31/0453; C23C 16/26; H01L 29/1606; H01L 29/66742; H01L 29/78684; H01L 29/78696
See application file for complete search history.

(56) References Cited

U.S. PATENT DOCUMENTS

| 5,555,255 A | 9/1996 | Kock et al. |
| 6,400,744 B1 | 6/2002 | Capasso et al. |

(Continued)

FOREIGN PATENT DOCUMENTS

| KR | 10-0850495 B1 | 8/2008 |
| KR | 10-2011-0109680 A | 10/2011 |

(Continued)

OTHER PUBLICATIONS

Beidou Guo, et al., "Controllable N-Doping of Graphene", Nano Letters, 2010, 10, Published on Web: Oct. 22, 2010, pp. 4975-4980, American Chemical Society.

(Continued)

*Primary Examiner* — Cheung Lee
*Assistant Examiner* — Stephen C Smith
(74) *Attorney, Agent, or Firm* — Sughrue Mion, PLLC

(57) ABSTRACT

A method of forming an amorphous carbon monolayer (ACM) and an electronic device including the ACM are provided. The method includes forming the ACM on a surface of a germanium (Ge) substrate via a chemical vapor deposition (CVD) process. The CVD process includes injecting a reaction gas including carbon-containing gas and hydrogen ($H_2$) gas in to a reaction chamber containing the Ge substrate, wherein a partial pressure of the $H_2$ gas in the reaction chamber may range from 1 Torr to 30 Torr.

17 Claims, 18 Drawing Sheets

(51) Int. Cl.
*H01L 29/66* (2006.01)
*H01L 29/16* (2006.01)
*C23C 16/26* (2006.01)
*C01B 32/186* (2017.01)

(52) U.S. Cl.
CPC .... *H01L 29/1606* (2013.01); *H01L 29/66742* (2013.01); *H01L 29/78684* (2013.01); *H01L 29/78696* (2013.01)

(56) References Cited

U.S. PATENT DOCUMENTS

| | | | |
|---|---|---|---|
| 6,501,783 B1 | 12/2002 | Capasso et al. | |
| 6,785,320 B1 | 8/2004 | Amos et al. | |
| 7,436,874 B2 | 10/2008 | Onishi et al. | |
| 7,820,132 B2* | 10/2010 | Dillon | B82Y 30/00 423/447.3 |
| 8,361,813 B1* | 1/2013 | Niyogi | H01L 21/02422 257/E51.04 |
| 8,968,587 B2* | 3/2015 | Shin | B82Y 30/00 216/51 |
| 2006/0099136 A1 | 5/2006 | Dillon | B82Y 30/00 423/447.3 |
| 2009/0011204 A1* | 1/2009 | Wang | B82Y 40/00 428/215 |
| 2010/0219418 A1* | 9/2010 | Sung | H01L 33/025 257/77 |
| 2011/0059599 A1* | 3/2011 | Ward | B82Y 30/00 438/507 |
| 2011/0140064 A1 | 6/2011 | Bandyopadhyay et al. | |
| 2011/0148284 A1 | 6/2011 | Nagao et al. | |
| 2011/0300338 A1* | 12/2011 | Shin | B82Y 30/00 428/156 |
| 2011/0315898 A1 | 12/2011 | Capasso et al. | |
| 2012/0063478 A1 | 3/2012 | Park | |
| 2012/0141700 A1 | 6/2012 | Choi et al. | |
| 2013/0070799 A1 | 3/2013 | Lee et al. | |
| 2015/0179743 A1* | 6/2015 | Niyogi | H01L 29/1606 257/29 |

FOREIGN PATENT DOCUMENTS

| | | |
|---|---|---|
| KR | 1020110109680 A | 10/2011 |
| KR | 10-2012-0063164 A | 6/2012 |

OTHER PUBLICATIONS

Jin Zhao, et al., "Synthesis of large-scale undoped and nitrogen-doped amorphous graphene on MgO substrate by chemical vapor deposition", Journal of Materials Chemistry, 2012, 22, Published on Jul. 27, 2012, pp. 19679-19683, The Royal Society of Chemistry.

Youwei Zhang, et al., "Direct growth of high-quality $Al_2O_3$ dielectric on graphene layers by dielectric on graphene layers by low-temperature $H_2O$-based ALD", Journal of Physics D: Applied Physics, 47, 2014, 055106, total 7 pages, IOP Publishing Ltd, published Jan. 4, 2014.

Tongxiang Cui, et al., "Low-temperature synthesis of multilayer graphene/amorphous carbon hybrid films and their potential application in solar cells", Nanoscale Research Letters 2012, 7:453, Published: Aug. 11, 2012, total 7 pages, Springer.

Yang-Bo Zhou, et al., "Ion irradiation induced structural and electrical transition in graphene", The Journal of Chemical Physics, 133, 234703, 2010, published online Dec. 20, 2010, total 6 pages, AIP Publishing.

* cited by examiner

1 Torr

10 Torr

30 Torr

50 Torr

METHOD OF FORMING AMORPHOUS CARBON MONOLAYER AND ELECTRONIC DEVICE INCLUDING AMORPHOUS CARBON MONOLAYER

RELATED APPLICATION

This application claims priority from Korean Patent Application No. 10-2014-0140165, filed on Oct. 16, 2014, in the Korean Intellectual Property Office, the disclosure of which is incorporated herein in its entirety by reference.

BACKGROUND

1. Field

Methods and apparatuses consistent with exemplary embodiments relate to an amorphous carbon monolayer (ACM), and more particularly, to a method of forming an ACM, and an electronic device including the ACM.

2. Description of the Related Art

Recently, the application of graphene in various fields (e.g., nanoelectronics, optoelectronics, and chemical sensors) has been the subject of active research. Graphene is a crystalline material having a hexagonal honeycomb structure in which carbon atoms are two-dimensionally connected to each other. Graphene is very thin, and, the thickness of a graphene layer may be equal to that of a monoatomic layer. Further, graphene exhibits excellent electric mobility and thermal characteristics, which are superior to those of silicon. Graphene may be synthesized via chemical vapor deposition (CVD) or may be obtained by peeling graphite layer by layer.

SUMMARY

Exemplary embodiments provide methods of forming an amorphous carbon monolayer (ACM) and electronic devices including the ACM.

According to an aspect of an exemplary embodiment, there is provided a method of forming an ACM, the method including forming the ACM on a surface of a germanium (Ge) substrate via a chemical vapor deposition (CVD) process. The CVD process may include injecting a reaction gas including carbon-containing gas and hydrogen ($H_2$) gas into a reaction chamber containing the Ge substrate, wherein the partial pressure of the $H_2$ gas in the reaction chamber may range from 1 Torr to 30 Torr.

A volume ratio of the carbon-containing gas to the $H_2$ gas may be at least 0.05. A processing temperature in the reaction chamber may range from 850° C. to 937° C. Inert gas may also be injected into the reaction chamber.

The Ge substrate may be provided on a supporting substrate. The Ge substrate may be provided on a supporting substrate by various methods such as CVD, PVD or wafer bonding. The supporting substrate may include a silicon (Si) wafer. The supporting substrate may include $SiO_2$, $Al_2O_3$, GaN, quartz, or Ge oxide.

In the ACM formed via CVD, a ratio of $sp^3$-bonded carbon atoms to $sp^2$-bonded carbon atoms may be 0.2 or less.

According to an aspect of another exemplary embodiment, there is provided a transistor device including: a substrate; an ACM provided on the substrate; source and drain electrodes provided on both sides of the ACM on the substrate; an insulating layer provided on the ACM; and a gate electrode provided on the insulating layer.

The ACM may be a channel layer.

A channel layer may be provided between the substrate and the ACM. The channel layer may include graphene. The ACM and the insulating layer may form a gate insulating layer.

A surface of the substrate may be coated with an insulating material.

According to an aspect of another exemplary embodiment, there is provided a gas sensor including first and second electrodes that are spaced apart; and an ACM that connects the first and second electrodes and is configured to function as a gas adsorption plate for a certain type of gas.

The ACM may be heated by applying a current to the first and second electrodes to remove gas that is adsorbed on the ACM.

According to an aspect of another exemplary embodiment, there is provided a transparent electrode structure includes a substrate; at least one (ACM provided on the substrate; and at least one graphene layer provided on the substrate.

The at least one ACM and the at least one graphene layer may be sequentially stacked, in that order, on the substrate. Alternatively, the at least one graphene layer and the at least one ACM may be sequentially stacked, in that order, on the substrate.

The at least one ACM may be stacked between a plurality of graphene layers or the at least one graphene layer may be stacked between a plurality of ACMs. The at least one ACM and the at least one graphene layer may be alternately stacked.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
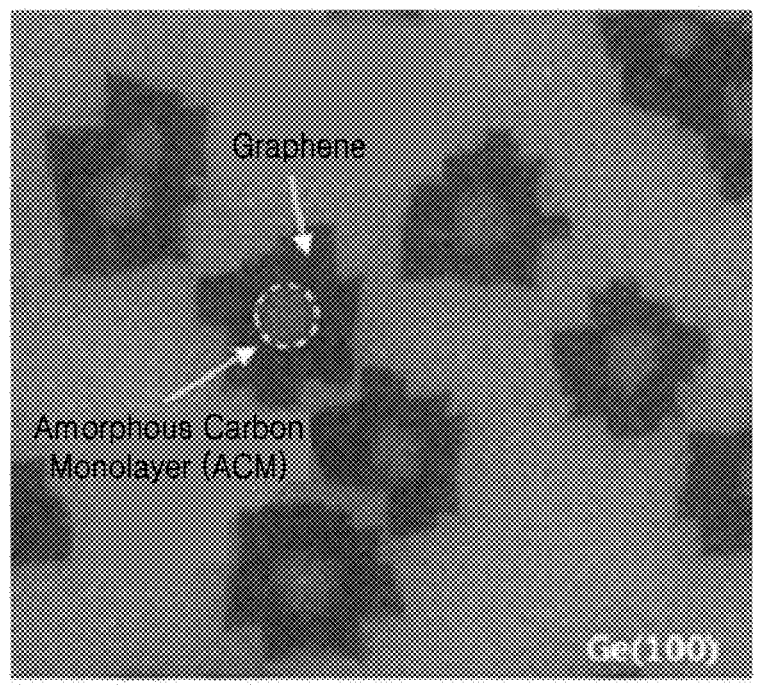
FIG. 1 is a scanning electron microscopy (SEM) image obtained by capturing an early growth stage of graphene grown on a surface of a Ge substrate via CVD.

Hereinafter, exemplary embodiments will be described more fully with reference to the accompanying drawings. In the drawings, like reference numerals denote like elements, and lengths and sizes of layers and regions may be exaggerated for clarity. It will be understood that when an element or layer is referred to as being "on" another element or layer, the element or layer can be directly on another element or layer or there may be intervening elements or layers. In contrast, when an element is referred to as being "directly on" another element or layer, no intervening elements or layers are present. Also, materials included in layers described in the exemplary embodiments below are only provided as examples, and other materials may be used. Expressions such as "at least one of," when preceding a list of elements, modify the entire list of elements and do not modify the individual elements of the list.

When graphene is synthesized via chemical vapor deposition (CVD), a growth substrate functions as a catalyst for providing a reaction with reaction gas, and also provides a lattice structure so that a hexagonal honeycomb structure of graphene may be easily formed. A transition metal substrate, for example, a copper (Cu) substrate, a nickel (Ni) substrate, or a platinum (Pt) substrate, may be generally used as a growth substrate when growing high-quality graphene via CVD. From these, Cu substrates are mostly used because the high-temperature solubility of carbon atoms is low and single layer synthesis is convenient.

During a CVD process, if carbon layer growth is performed on a surface of the transition metal substrate at a temperature that is at least about 500° C. lower than the about 1000° C. synthesis temperature of graphene, carbon atoms may bond to each other without the hexagonal honeycomb structure that has the greatest energy stability, and thus, an amorphous carbon film having a random amorphous structure may grow. The amorphous carbon film grown in such a manner may have a multi-layer structure, which may be formed via the stacking of a plurality of carbon atoms.

Recently, research regarding the use of a Ge substrate as a growth substrate for graphene has been conducted. A method of growing graphene on a surface of the Ge substrate via CVD will be described hereinafter. Carbon-containing gas (e.g., methane ($CH_4$) gas) and $H_2$ gas are injected into a reaction chamber. Next, the reaction chamber is heated to a predetermined temperature. Then, a chemical reaction occurs as a result of pyrolysis on the surface of the Ge substrate having a high temperature, and thus, graphene is grown on the Ge substrate. In this implementation, the surface of the Ge substrate functions as a catalyst that provides for the reaction with the carbon-containing gas and $H_2$ gas, and graphene is formed as carbon atoms bond to each other on only the surface of the Ge substrate.

A Ge substrate is a IV-group semiconductor substrate and has a higher lattice constant than that of a transition metal substrate. The lattice constant of a Ge substrate is greatly different from a lattice constant of graphene. As a result, there is a large lattice mismatch between the Ge substrate and graphene. Since the lattice mismatch caused by the Ge substrate may be problematic when synthesizing graphene having excellent crystalline properties, when graphene is grown using a Ge substrate, the growth speed has to be substantially decreased in order to obtain high-quality graphene.

The growth speed of graphene during a CVD process may be controlled by a processing temperature, a type of carbon-containing gas, or processing pressure. When a Ge substrate is used as the growth substrate, graphene and an ACM, which will be described below, may both be synthesized without changing the processing temperature.

Here, an ACM refers to a material layer having a random amorphous structure and which is formed from a two-dimensional (2D) single carbon atom layer. The ACM may also be referred to as amorphous graphene. Graphene, it is noted, is a crystalline material having a hexagonal honeycomb structure in which carbon atoms are two-dimensionally connected to each other. Graphene may have a single layer structure or a multi-layer structure. On the other hand, an ACM is different from graphene in that the ACM includes an amorphous material having randomly connected carbon atoms and has a single layer structure. Also, as described above, although the amorphous carbon film, synthesized at a low temperature on the surface of the transition metal substrate, may include an amorphous material, the amorphous carbon film may be different from the ACM in that the amorphous carbon film may have a bulk structure.

When crystallization is controlled by controlling the processing temperature, molecules of carbon-containing gas may bond to each other even though the dehydrogenation process is incomplete, and thus, the amount of $sp^3$-bonded carbon atoms may be increased. Since π-bonds are subsequently decreased in a material including lots of $sp^3$-bonded carbon atoms, such a material may not have the following properties: electric conductivity, charge mobility, optical absorption, and the ability to generate photoelectrons. Therefore, in order to realize the unique electric and optical functions of graphene, an ACM, which is grown by using a Ge substrate as a growth substrate via CVD, has to have a high percentage of $sp^2$-bonded carbon atoms. As described below, an ACM may be effectively synthesized via CVD using a Ge substrate, which has a large lattice mismatch with graphene, as the growth substrate.

FIG. 1 is a scanning electron microscopy (SEM) image obtained by capturing an early growth stage of graphene grown on a surface of a Ge substrate via CVD. The Ge substrate used as a growth substrate has a (100) crystal plane.

Referring to FIG. 1, islands, which are bright areas surrounded by dark areas, grow at an early growth stage. In FIG. 1, the dark areas indicate graphene, and the bright areas surrounded by graphene are identified as ACMs via a Raman spectrum analysis or a HRTEM analysis. In order to control growth behaviors of the ACMs and graphene, research has been conducted regarding the CVD processing conditions. The research shows that a pressure of reaction gas injected into a reaction chamber has the greatest effect on the growth of the ACMs and graphene. Specifically, reaction gas, for example, carbon-containing gas (e.g., $CH_4$ gas) and $H_2$ gas, may be injected into the reaction chamber during a CVD process for growing graphene on the Ge substrate. A partial pressure of $H_2$ gas that is injected into the reaction chamber has the greatest effect on the growth behaviors of the ACMs and graphene.

Figure 2:
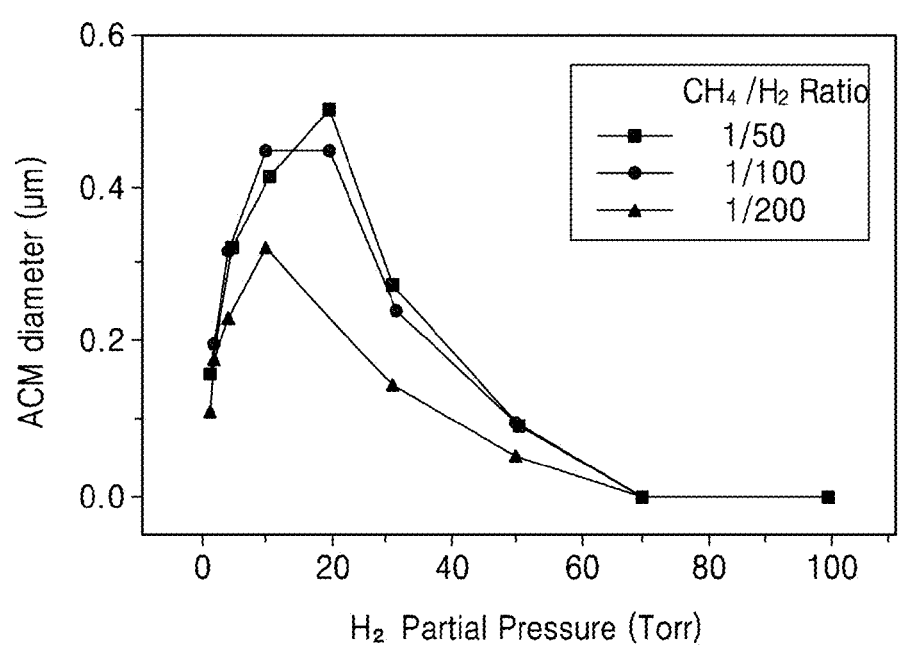
FIG. 2 is a graph showing changes in a diameter of an ACM grown according to a partial pressure of $H_2$ gas during a CVD process.
Figure 3A:
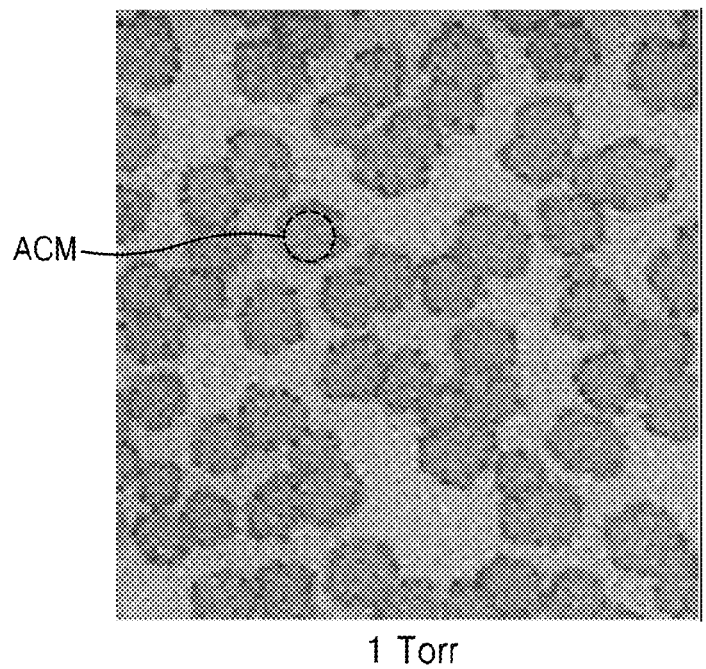
FIGS. 3A to 3D are SEM images obtained by capturing an ACM when the partial pressure of $H_2$ gas is 1 Torr, 10 Torr, 30 Torr, and 50 Torr, respectively, during the CVD process.
Figure 3B:
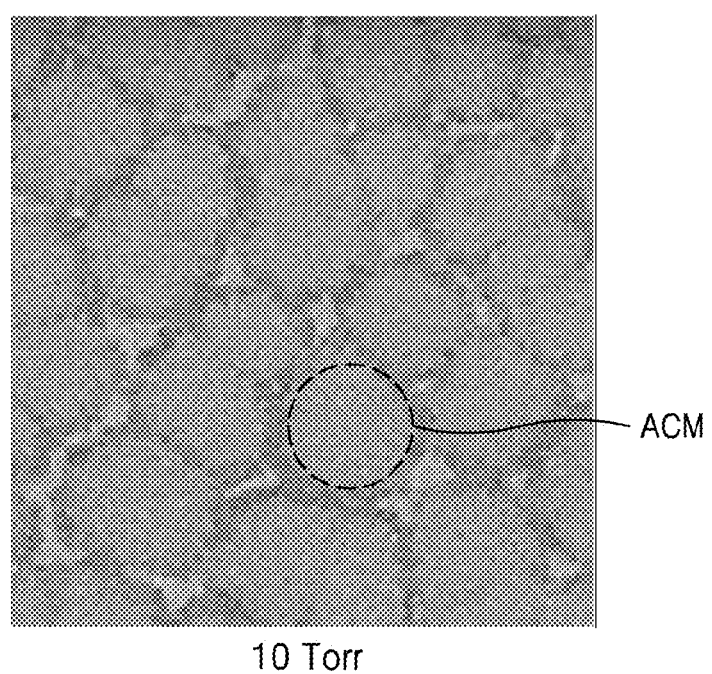
Figure 3C:
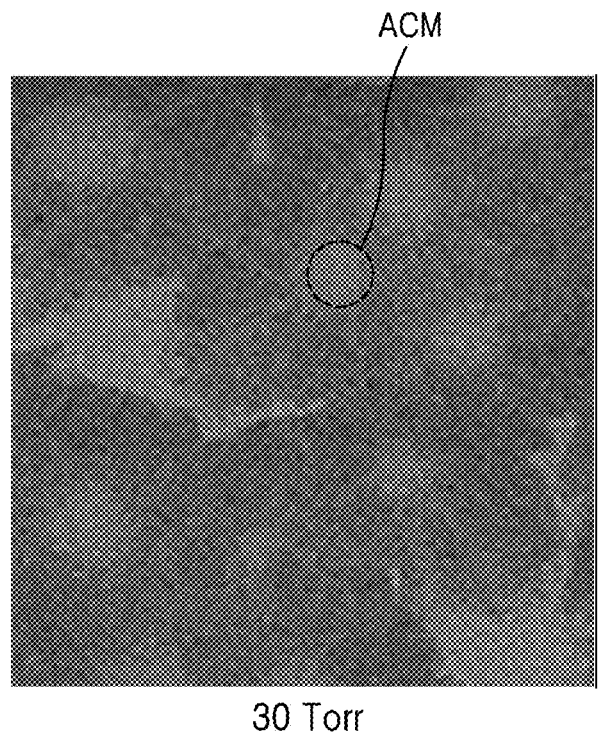
Figure 3D:
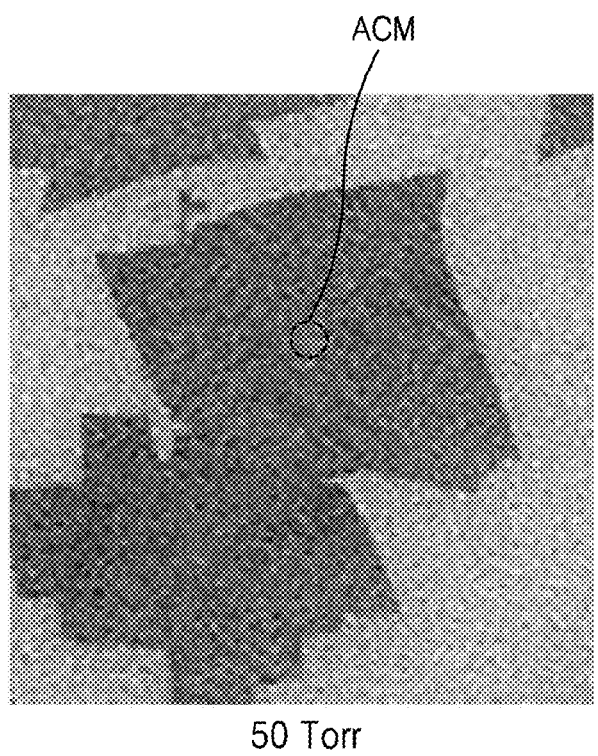

FIG. 2 is a graph showing changes in diameter of an ACM grown as a function of the partial pressure of $H_2$ gas during a CVD process. The Ge substrate 100 having a (100) crystal plane is used as a growth substrate.

Referring to FIG. 2, when a volume ratio of $CH_4$ gas to $H_2$ gas ($CH_4/H_2$ volume ratio) is constant, growth of the ACM rapidly increased as the partial pressure of $H_2$ gas is increased in a range from about 10 Torr to about 20 Torr. Also, when the partial pressure of $H_2$ gas exceeded a certain value, the growth of the ACM decreased as the partial pressure of $H_2$ gas increased. FIG. 2 shows that when the partial pressure of $H_2$ gas is higher than about 70 Torr, the ACM did not grow.

FIGS. 3A to 3D are SEM images obtained by capturing an ACM when the partial pressure of $H_2$ gas is 1 Torr, 10 Torr, 30 Torr, and 50 Torr, respectively, during a CVD process. Referring to FIGS. 3A to 3D, a size of the ACM increased when the partial pressure of the $H_2$ gas increased from 1 Torr to 10 Torr. However, the size of the ACM decreased when the partial pressure of $H_2$ gas increased to 30 Torr and 50 Torr.

Carbon-containing gas (e.g., $CH_4$ gas), which is injected into a reaction chamber, provides carbon that is necessary for growing graphene. The $H_2$ gas that is injected into the reaction chamber may assist in the dehydrogenation of $CH_4$ gas on the surface of the Ge substrate, and it may also perform an etching function, that is, it may serve to remove carbon from edges of graphene islands that may be formed at an early growth stage. Accordingly, the etching function of $H_2$ gas may become more active as the partial pressure of the $H_2$ gas is increased, and thus, growth of the ACM, which is etched relatively easily, may be suppressed. Therefore, when the partial pressure of the $H_2$ gas is greater than about 70 Torr, the ACM may not be formed, and only graphene may be grown. Since the growth of the ACM mainly occurs when the partial pressure of the $H_2$ gas is less than about 20 Torr, at which point the ACM is actively grown, it may be the case that only the ACM according to the present embodiment may be formed over the entire surface of a Ge substrate. In this case, a processing temperature may be, for example, lower than a melting point (937° C.) of Ge. However, the processing temperature is not limited thereto.

As described above, when a given processing condition (in particular, the partial pressure of $H_2$ gas) is adjusted during the CVD process, the ACM according to the present embodiment, which has an amorphous structure and which is formed from a 2D single carbon atomic layer, may be grown on the surface of the Ge substrate. This will be described in detail below.

First, a Ge substrate is prepared. The Ge substrate may be used individually or may be used after having been prepared on a supporting substrate. The supporting substrate may include, for example, a silicon (Si) wafer. However, the supporting substrate is not limited thereto, and may also include, for example, $SiO_2$, $Al_2O_3$, GaN, quartz, or Ge oxide. The Ge substrate may be provided on the supporting substrate by various method such as CVD, PVD or wafer bonding.

Next, the Ge substrate is provided into the reaction chamber, and reaction gas is injected into the reaction chamber. The reaction gas may include a carbon-containing gas and $H_2$ gas. The carbon-containing gas may include, for example, $CH_4$ gas, but is not limited thereto. Various types of gas that contain carbon may be used. The carbon-containing gas (e.g., $CH_4$ gas) may provide carbon, and the $H_2$ gas may assist dehydrogenation of carbon-containing gas (e.g., $CH_4$ gas) on the surface of the Ge substrate.

As for the processing conditions for growing an ACM, the partial pressure of $H_2$ gas that is injected into the reaction chamber may be adjusted to be within the range of from about 1 Torr to about 30 Torr. The carbon-containing gas and the $H_2$ gas that are injected into the reaction chamber may have a predetermined ratio. Specifically, a volume ratio of the carbon-containing gas to the $H_2$ gas may be about 0.05 or above. In addition, an inert gas, for example, argon (Ar) gas or nitrogen ($N_2$) gas, may be injected into the reaction chamber.

Next, the inside of the reaction chamber is heated to a predetermined processing temperature. The processing temperature may be, for example, lower than the melting point (937° C.) of Ge, and may be particularly in a range of from about 850° C. to about 937° C. However, the processing temperature is not limited thereto.

Under the above-described processing conditions, the ACM may be uniformly grown over the entire surface of a Ge substrate via CVD. In the ACM formed via CVD, a ratio of $sp^3$-bonded carbon atoms to $sp^2$-bonded carbon atoms may be about 0.2 or less, as described below. Because a percentage of the $sp^3$-bonded carbon atoms in the ACM is low, the ACM may exhibit unique electric and optical functions, like graphene.

Figure 4:
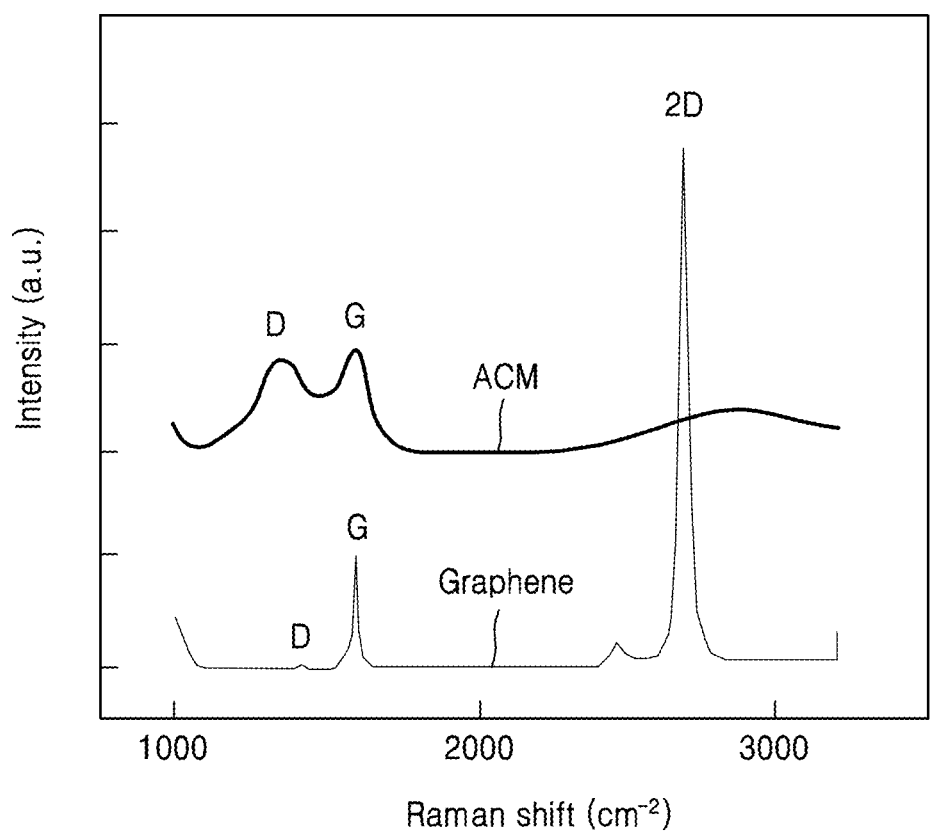
FIG. 4 is a Raman analysis of graphene and an ACM grown over an entire surface of a Ge substrate via CVD.

FIG. 4 is a Raman analysis of graphene and an ACM grown over an entire surface of a Ge substrate via CVD.

In order to grow graphene over the entire surface of the Ge substrate, graphene was grown for 5 hours with a partial pressure of $H_2$ gas set to 90 Torr and a processing temperature set to 920° C. In addition, $CH_4$ gas and $H_2$ gas were injected into the reaction chamber at 5 sccm and 500 sccm, respectively. A volume ratio of $CH_4$ gas to $H_2$ gas was about 0.01. In order to grow the ACM over the entire surface of the Ge substrate, the partial pressure of $H_2$ gas was set to 4 Torr and the processing temperature was set to 920° C. such that the ACM was grown within a shorter amount of time than graphene. In addition, $CH_4$ gas and $H_2$ gas were injected into the reaction chamber at 3 sccm and 15 sccm, respectively. The volume ratio of $CH_4$ gas to $H_2$ gas was about 0.2. The Raman analysis shown in FIG. 4 was identical in all areas of the entire surface of the Ge substrate, which indicates that graphene and the ACM were uniformly grown over the entire surface of the Ge substrate.

The Raman analysis shown in FIG. 4 was obtained after transferring the graphene and the ACM, which are grown on the surface of a Ge substrate, onto a Si wafer having a $SiO_2$ layer formed thereon. The method used to make such a transfer in the present embodiment is a generally known method and will be described below. Hereinafter, an example of graphene will be described. First, gold (Au) having a thickness of 30 nm is deposited on graphene grown on the surface of a Ge substrate. Next, a solution, formed by melting poly(methyl methacrylate) (PMMA) in chloroform, is coated at a thickness of 100 nm on the Au layer by using a spin coating method, and is then dried. When the resulting dried structure is provided onto a mixed solution of $H_2O_2$, HCl, and HF, the Ge substrate melts and is thus removed. Subsequently, the PMMA layer, the Au layer, and the graphene are cleaned in deionized (DI) water, and the cleaned layers are transferred onto the Si wafer having the $SiO_2$ layer formed thereon. Afterward, the PMMA layer is removed using an acetone solution, the Au layer is removed using an Au etchant, and a cleaning process is performed using the DI water. Thus, the transfer method is finished.

Referring to FIG. 4, a line representing graphene shows a typical Raman peak. Specifically, a 2D-band (at about 2700 $cm^{-1}$) is about five times as intense as a G-band (at about 1580 $cm^{-1}$), which indicates that graphene has excellent resonance properties as a result of π-bonds formed between carbon atoms and has a single layer structure. Also, an intensity ratio of a D-band (at about 1350 $cm^{-1}$), which is indicative of structural defects, to the G-band is about 0.04, and thus, the graphene has properties that are superior to those of the graphene in related art that is synthesized using a transition metal substrate. Meanwhile, because the ACM is not crystalline, an intensity of its 2D-band is greatly decreased, but an intensity of its D-band is increased, as compared to the 2D-band and the D-band of graphene.

Figure 5:
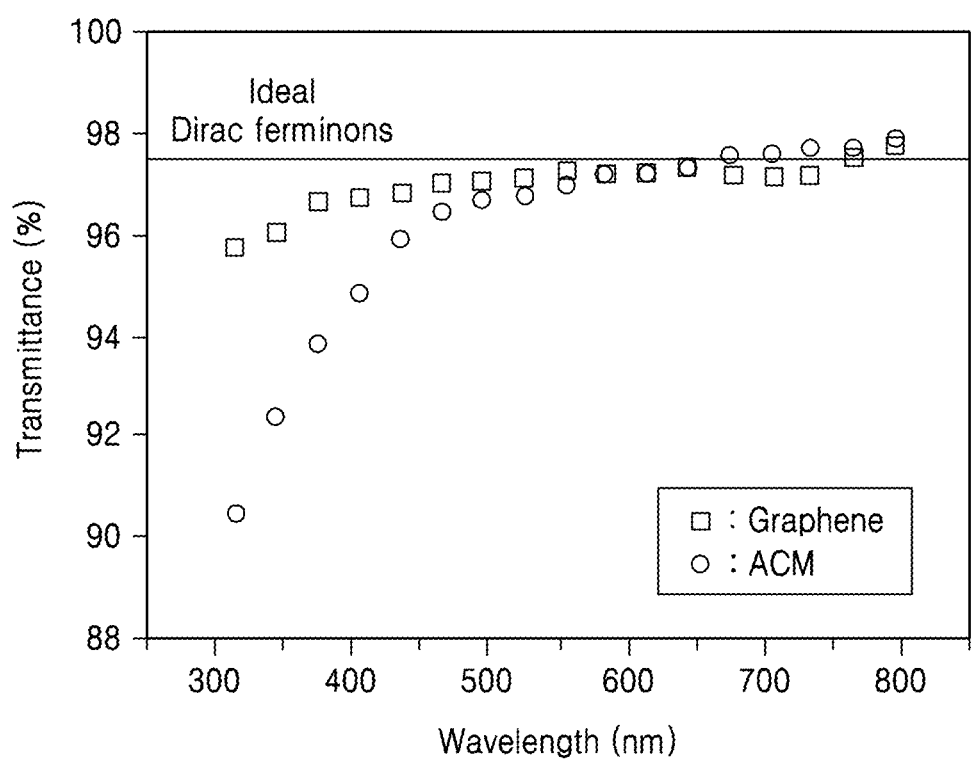
FIG. 5 is a graph showing transmittances of graphene and an ACM, respectively, grown over an entire surface of a Ge substrate via CVD.

FIG. 5 is a graph showing transmittances of graphene and an ACM grown over an entire surface of a Ge substrate via CVD. The result shown in FIG. 5 was obtained after transferring the graphene and the ACM, which were grown on the surface of a Ge substrate, onto a quartz substrate. The methods of growing and transferring the graphene and the ACM were the same as those described with reference to FIG. 4.

Referring to FIG. 5, the transmittance of graphene is about 97% in visible wavelengths, and the transmittance of the graphene decreased in an ultraviolet range at wavelengths of 450 nm or less, as compared to the visible wavelengths area. A transmittance of the ACM is almost the same as that of graphene in the visible wavelengths area, but the transmittance of the ACM rapidly decreases in the ultraviolet wavelengths area as the wavelengths become short. This may be because the ACM has more defects than graphene, and thus carbon-containing gas, for example, hydrocarbon gas, in the air is adsorbed more onto the ACM. However, since the transmittance of the ACM is almost the same as that of graphene in the visible wavelengths area at wavelengths of at least 450 nm, the ACM grown on the surface of the Ge substrate may have a single layer structure, like graphene.

Figure 6A:
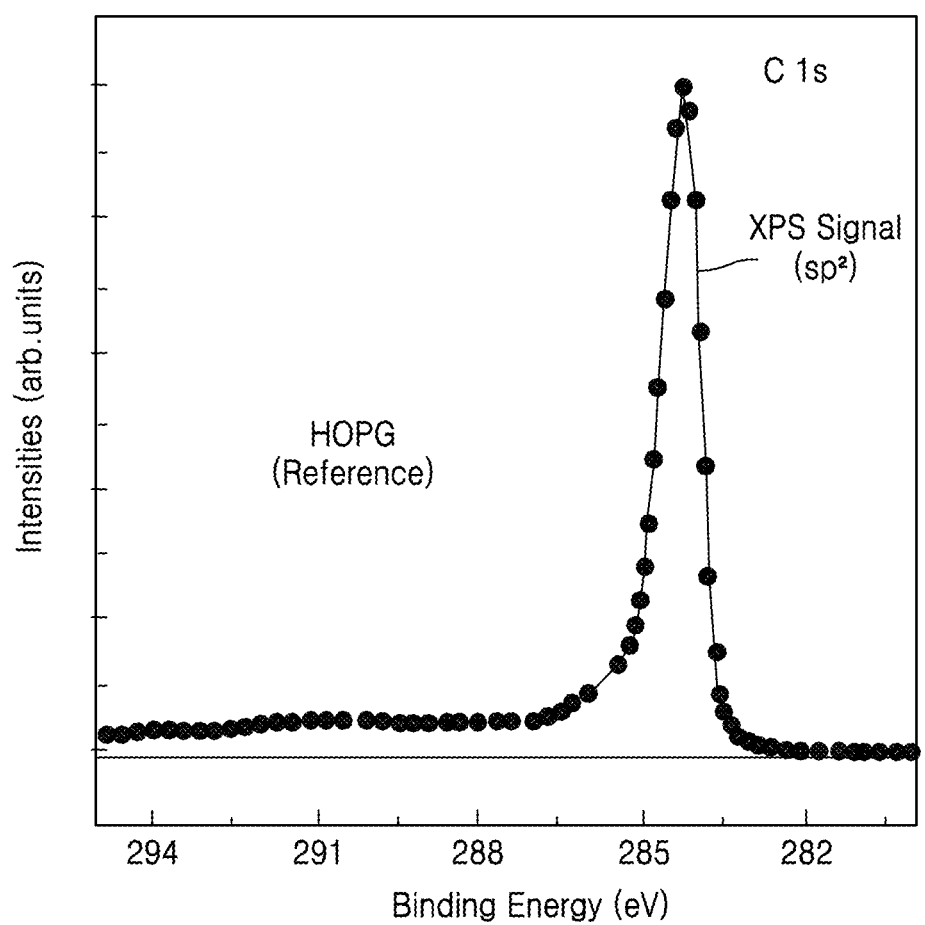
FIG. 6A is a graph of an X-ray photoelectron spectroscopy (XPS) analysis of highly oriented pyrolytic graphite (HOPG)
Figure 6B:
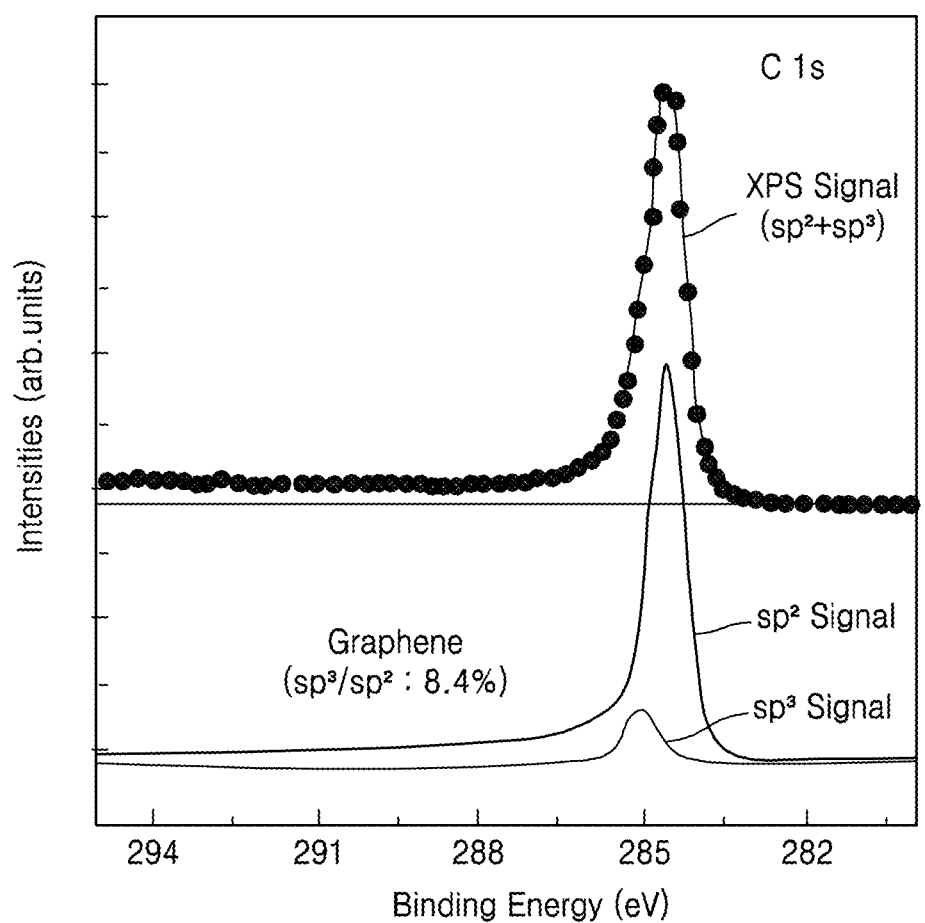
FIG. 6B is an XPS analysis of graphene grown via CVD.
Figure 6C:
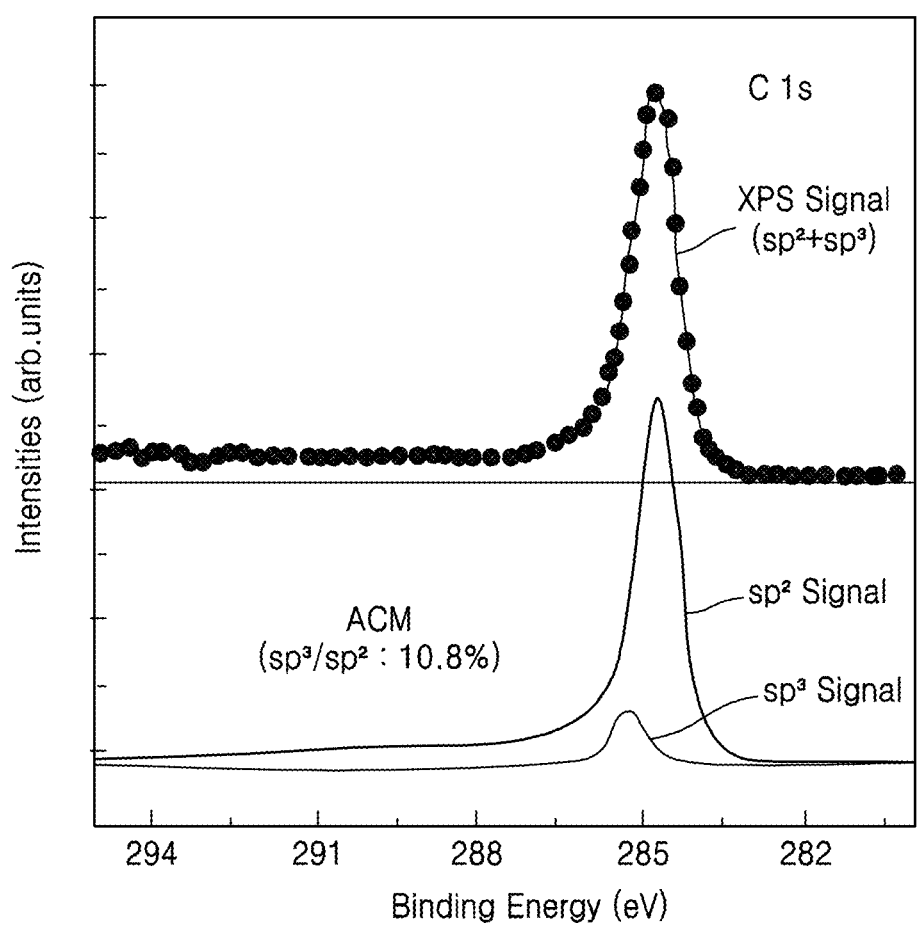
FIG. 6C is an XPS analysis of an ACM grown via CVD.

FIG. 6A is a graph of an X-ray photoelectron spectroscopy (XPS) analysis of highly oriented pyrolytic graphite (HOPG). FIG. 6B is an XPS analysis of graphene grown via CVD. FIG. 6C is an XPS analysis of an ACM grown via CVD. "C 1s" shown in FIGS. 6A to 6C indicates an electron state of the 1s orbital in a carbon atom. A fit test was performed based on the Doniach-Šunjić model and the Voigt model to quantitatively analyze a ratio of $sp^3$-bonded carbon atoms to $sp^2$-bonded carbon atoms.

Referring to FIG. 6A, the HOPG is completely formed from $sp^2$-bonded carbon atoms. Referring to FIG. 6B, the ratio of $sp^3$-bonded carbon atoms to $sp^2$-bonded carbon atoms is about 8.4% (i.e., 0.084) in graphene grown via CVD. Referring to FIG. 6C, the ratio of $sp^3$-bonded carbon atoms to $sp^2$-bonded carbon atoms is about 10.8% (i.e., 0.108) in the ACM grown via CVD. Since the HOPG has excellent crystalline properties and no defects because it is synthesized at a temperature (e.g., at least about 2500° C.) much higher than a general CVD processing temperature (e.g., about 1000° C.), the HOPG is only formed from $sp^2$-bonded carbon atoms. However, graphene grown via CVD has a lower processing temperature than the HOPG. In addition, a surface of the graphene may be contaminated by an external environment, and thus, $sp^3$-bonded carbon atoms may be formed. Since the ratio of $sp^3$-bonded carbon atoms to $sp^2$-bonded carbon atoms only increased by about 2%, as compared to graphene grown via CVD, it may be understood that the ACM grown via CVD is mostly formed from $sp^2$-bonded carbon atoms, like graphene grown via CVD.

Figure 7A:
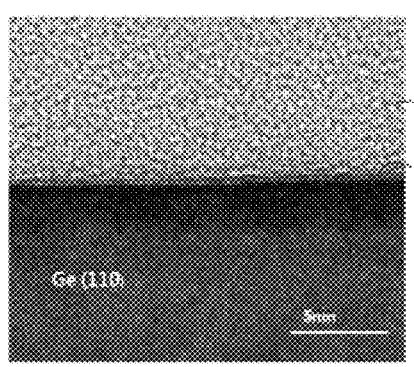
FIG. 7A is a high-resolution transmission electron microscopy (HRTEM) image obtained by capturing a cross-section of an ACM grown on a surface of a Ge substrate via CVD.
Figure 7B:
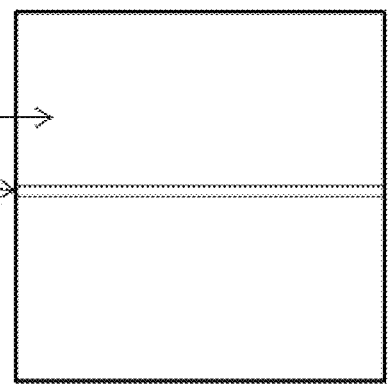
FIG. 7B is a line drawing of FIG. 7A.

FIG. 7A is an HRTEM image obtained by capturing a cross-section of an ACM grown on a surface of a Ge substrate via CVD. Referring to FIG. 7A, the ACM is formed as a single layer on the surface of the Ge substrate. In FIG. 7A, amorphous carbon, which is covering the ACM, has been additionally deposited to manufacture a specimen for a cross-sectional HRTEM image.

Figure 8A:
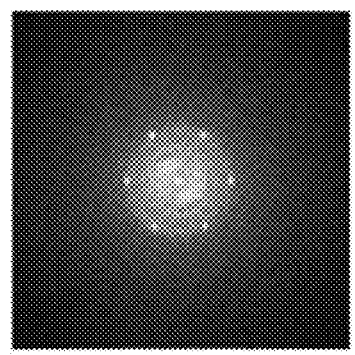
FIG. 8A is a selected area electron diffraction (SAED) pattern of graphene grown on the surface of a Ge substrate via CVD.
Figure 8B:
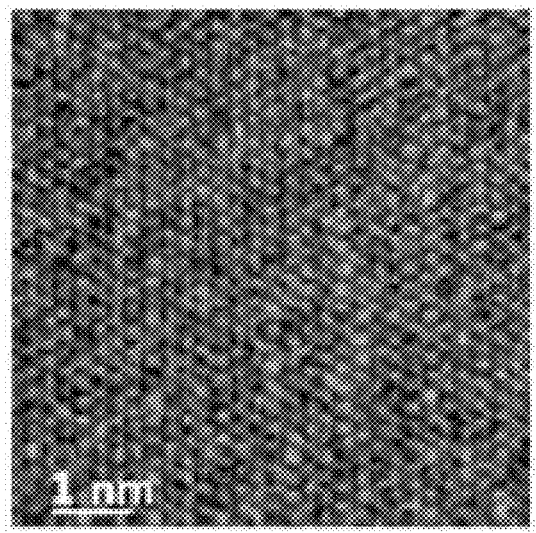
FIG. 8B is an HRTEM image of graphene.
Figure 8C:
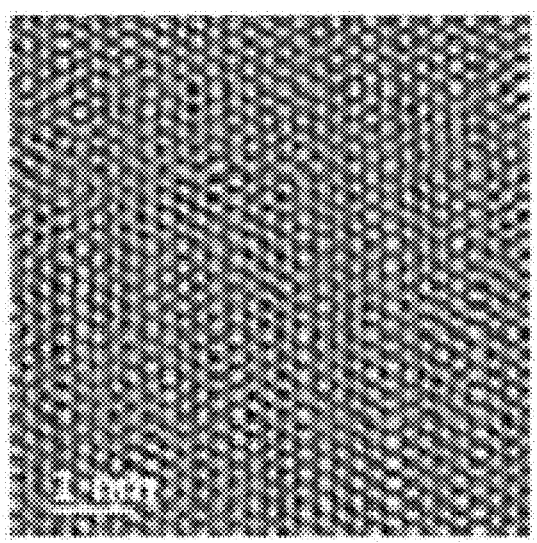
FIG. 8C is a filtered HRTEM image of graphene obtained by mask filtering the SAED pattern.
Figure 9A:
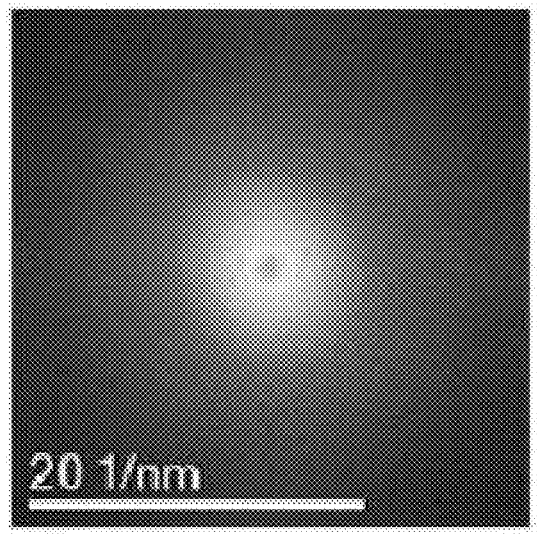
FIG. 9A is an SAED pattern of an amorphous carbon film having a multi-layer structure grown on a surface of a copper (Cu) substrate via CVD.
Figure 9B:
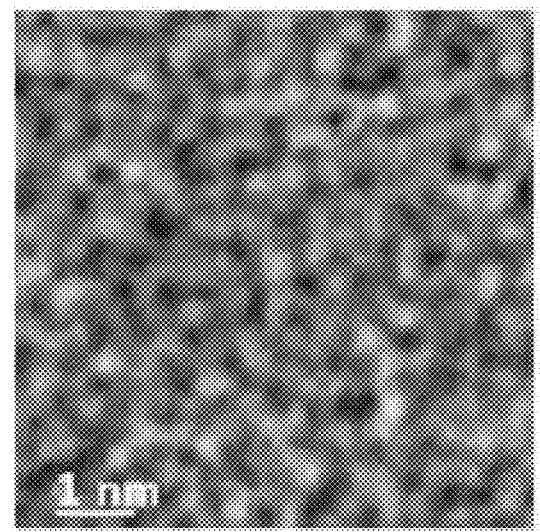
FIG. 9B is an HRTEM image of the amorphous carbon film.
Figure 9C:
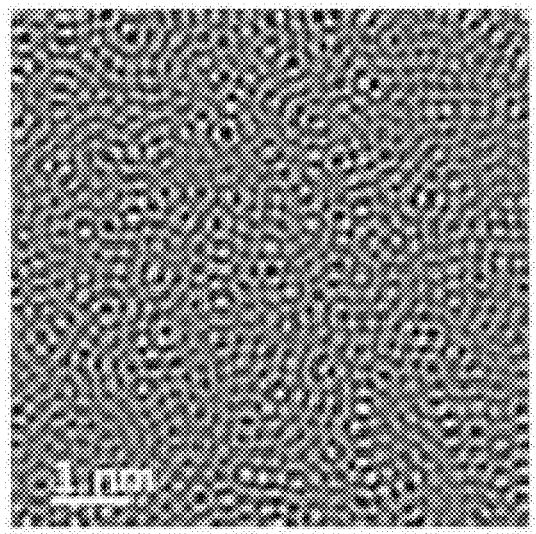
FIG. 9C is a filtered HRTEM image of the amorphous carbon film obtained by mask filtering the SAED pattern.
Figure 10A:
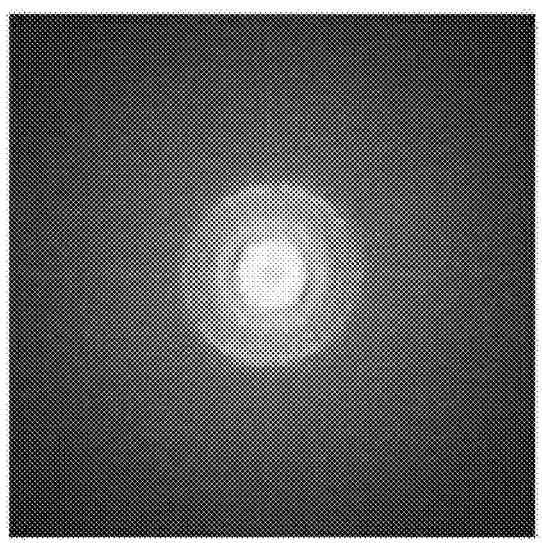
FIG. 10A is an SAED pattern of an ACM grown on a surface of a Ge substrate via CVD.
Figure 10B:
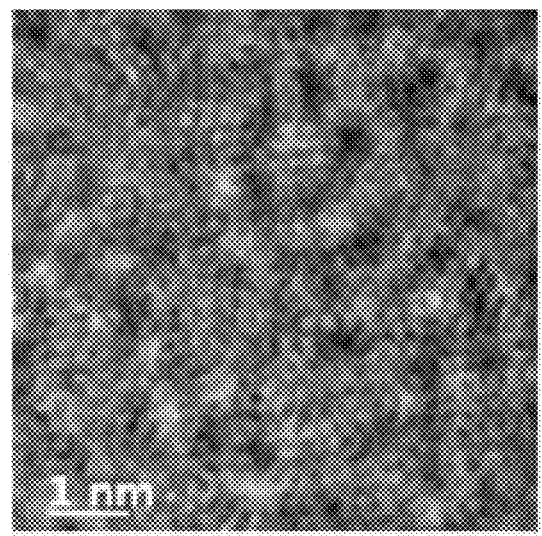
FIG. 10B is an HRTEM image of the ACM.
Figure 10C:
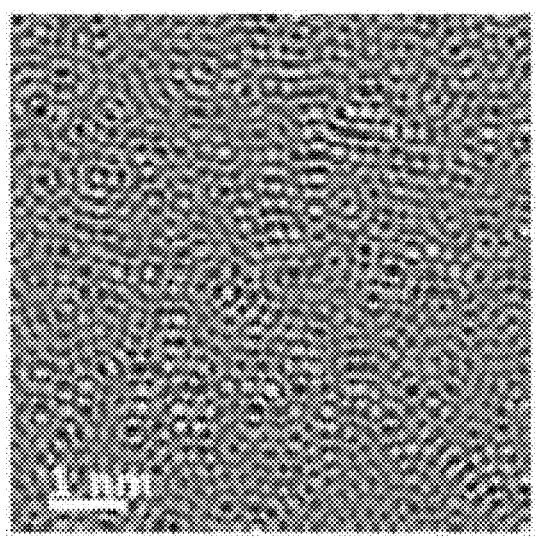
FIG. 10C is a filtered HRTEM image of the ACM obtained by mask filtering the SAED pattern.

FIG. 8A is a selected area electron diffraction (SAED) pattern of graphene grown on a surface of a Ge substrate via CVD. FIG. 8B is an HRTEM image of graphene. FIG. 8C is a filtered HRTEM image of graphene obtained by mask filtering the SAED pattern. FIG. 9A is an SAED pattern of an amorphous carbon film having a multi-layer structure grown on a surface of a Cu substrate via CVD. FIG. 9B is an HRTEM image of the amorphous carbon film. FIG. 9C is a filtered HRTEM image of the amorphous carbon film obtained by mask filtering the SAED pattern. FIG. 10A is an SAED pattern of an ACM grown on a surface of a Ge substrate via CVD. FIG. 10B is an HRTEM image of the ACM. FIG. 10C is a filtered HRTEM image of the ACM obtained by mask filtering the SAED pattern.

FIGS. 8C, 9C, and 10C are compared below. The filtered HRTEM image of the ACM shown in FIG. 10C is very similar to the filtered HRTEM image of the amorphous carbon film shown in FIG. 9C and is largely different from the filtered HRTEM image of graphene shown in FIG. 8C. Therefore, it may be understood that the ACM according to the present embodiment has a random amorphous structure, like the amorphous carbon film.

By controlling a partial pressure of $H_2$ gas and a ratio of carbon-containing gas to $H_2$ gas during a CVD process, as described above, the ACM, which has an amorphous structure and is formed from a 2D single carbon atom layer, may be grown over an entire surface of a Ge substrate. Further, since the ACM is mostly formed from $sp^2$-bonded carbon atoms, like graphene, the ACM may have excellent optical and electric properties. Such an ACM may be applied to various fields of electronics.

Figure 11:
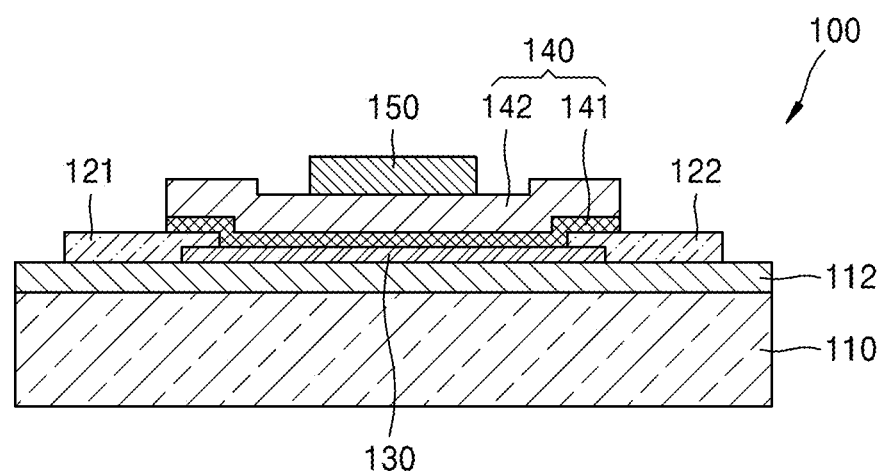
FIG. 11 is a cross-sectional view of a transistor device according to an exemplary embodiment.

FIG. 11 is a cross-sectional view of a transistor device 100 according to an exemplary embodiment.

Referring to FIG. 11, the transistor device 100 may include a substrate 110, a channel layer 130 provided on the substrate 110, a source electrode 121 and a drain electrode 122 provided on both sides of the channel layer 130, a gate insulating layer 140 provided on the channel layer 130 between the source and drain electrodes 121 and 122, and a gate electrode 150 provided on the gate insulating layer 140.

A semiconductor substrate, for example, a silicon substrate, may be used as the substrate 110. However, the substrate 110 is not limited thereto, and substrates formed from various materials may be used. Also, an upper surface of the substrate 110 may be coated with an insulating material 112, including for example, silicon oxide, to insulate the channel layer 130 from the substrate 110. The insulating material 112 may not be necessary when the substrate 110 includes an insulating material.

The channel layer 130 is provided on the substrate 110. The channel layer 130 may include a single graphene layer or a plurality of graphene layers. The source and drain electrodes 121 and 122 are provided on both sides of the channel layer 130 that includes graphene, such that the source and drain electrodes 121 and 122 are electrically connected to the channel layer 130. The source and drain electrodes 121 and 122 may include metal or a metal alloy. The metal may include a material that may form an ohmic contact with the channel layer 130, and for example may be at least one selected from the group consisting of Au, Cu, Ni, titanium (Ti), platinum (Pt), ruthenium (Ru), and palladium (Pd). The metal alloy may also include, for example, a conductive oxide. The source and drain electrodes 121 and 122 may have a single layer structure or a multi-layer structure.

The gate insulating layer 140 is provided on the channel layer 130 between the source and drain electrodes 121 and 122. The gate insulating layer 140 may include an ACM 141 provided on the channel layer 130 and an insulating layer 142 provided on the ACM 141. The ACM 141 refers to a material layer having a random amorphous structure and which is formed from a 2D single carbon atom layer, as described above. The insulating layer 142 may include various insulating materials, including for example, silicon nitride, silicon oxide, silicon oxynitride, aluminum oxide, hafnium oxide, or insulating polymer, but is not limited thereto.

The gate electrode 150 is provided on the gate insulating layer 140. The gate electrode 150 may include metal. The gate electrode 150 may include a material that is the same as or different from the source and drain electrodes 121 and 122. For example, the gate electrode 150 may include, but is not limited to, at least one selected from the group consisting of Au, Cu, Ni, Ti, Pt, Ru, and Pd. The gate electrode 150 may have a single layer structure or a multi-layer structure.

In the transistor device 100 having the above-described structure, the ACM 141 is formed on an upper surface of the channel layer 130 formed from graphene. The ACM 141 may not only function as a gate insulating layer with the insulating layer 142, but also may function as a buffer layer so that the insulating layer 142 is uniformly deposited.

Figure 12A:
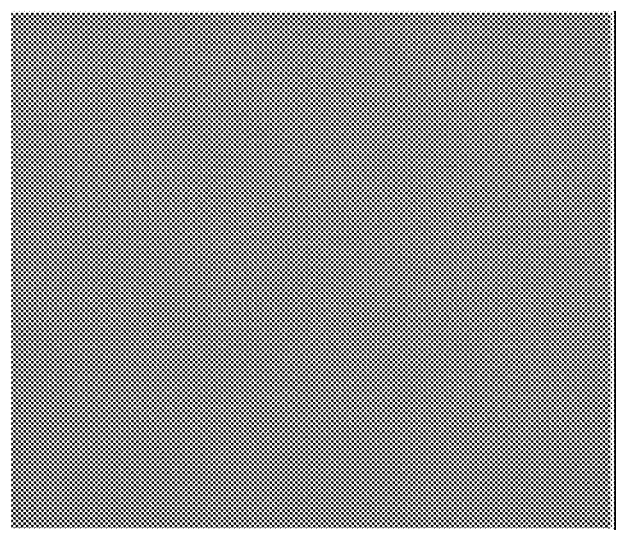
FIG. 12A is an SEM image obtained by capturing an $Al_2O_3$ layer deposited on a surface of an ACM grown on a Ge substrate.
Figure 12B:
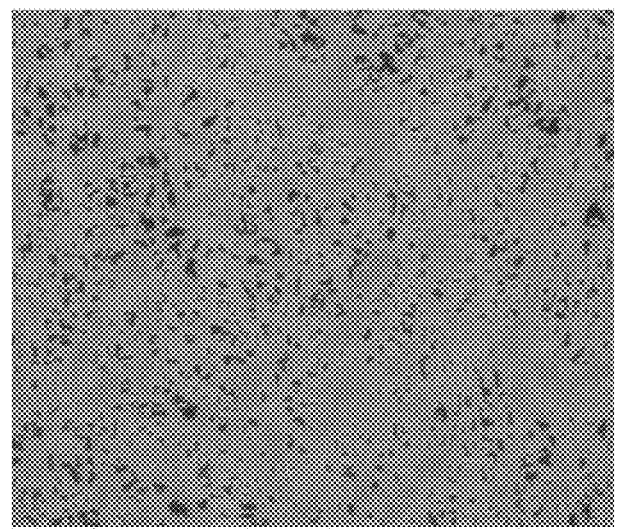
FIG. 12B is an SEM image obtained by capturing an $Al_2O_3$ layer deposited on a surface of graphene grown on a Ge substrate.
Figure 12C:
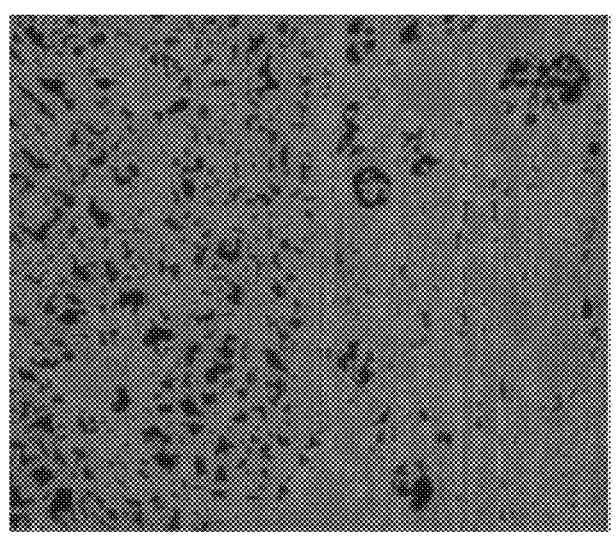
FIG. 12C is an SEM image obtained by capturing an $Al_2O_3$ layer deposited on a surface of graphene grown on a Cu substrate.

FIG. 12A is an SEM image obtained by capturing an $Al_2O_3$ layer deposited on a surface of an ACM grown on a Ge substrate. FIG. 12B is an SEM image obtained by capturing an $Al_2O_3$ layer deposited on a surface of graphene grown on a Ge substrate. FIG. 12C is an SEM image obtained by capturing an $Al_2O_3$ layer deposited on a surface of graphene grown on a Cu substrate. FIGS. 12A to 12C show SEM images that are obtained by depositing an $Al_2O_3$ layer having a thickness of 20 nm on surfaces of the ACM and graphene by using atomic layer deposition (ALD), and then capturing a surface of the $Al_2O_3$ layer.

Referring to FIG. 12A, the $Al_2O_3$ layer is uniformly deposited on the surface of the ACM. On the other hand, referring to FIGS. 12B and 12C, the $Al_2O_3$ layer is not uniformly deposited over entire surfaces of graphene grown on the Ge substrate and graphene grown on the Cu substrate. These results indicate that an insulating layer, for example, the $Al_2O_3$ layer, may be uniformly formed on the surface of the ACM. Therefore, by forming the ACM 141 on the channel layer 130 formed from graphene and forming the insulating layer 142 on the ACM 141, an equivalent oxide thickness (EOT) may be reduced, and thus, the transistor device 100, which may be operated with a low driving voltage and low driving power, may be manufactured.

Figure 13:
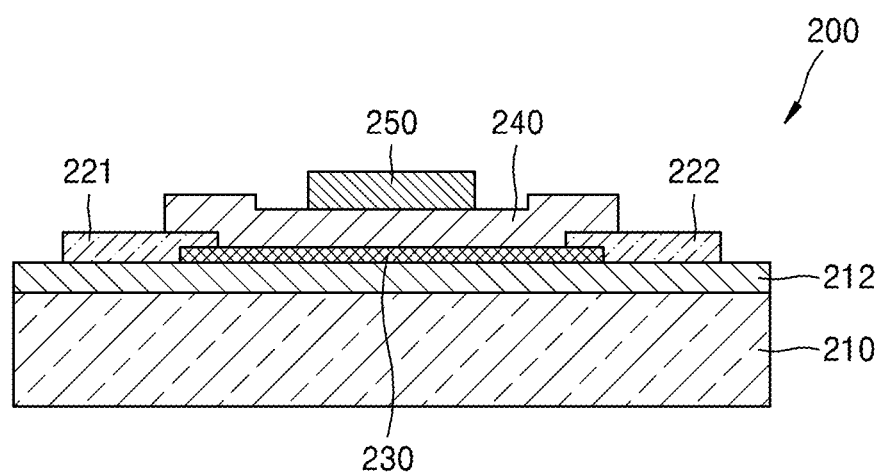
FIG. 13 is a cross-sectional view of a transistor device according to another exemplary embodiment.

FIG. 13 is a cross-sectional view of a transistor device 200 according to another exemplary embodiment.

Referring to FIG. 13, the transistor device 200 may include a substrate 210, a channel layer 230 provided on the substrate 210, a source electrode 221 and a drain electrode 222 provided on both sides of the channel layer 230, a gate insulating layer 240 provided on the channel layer 230 between the source and drain electrodes 221 and 222, and a gate electrode 250 provided on the gate insulating layer 240.

An upper surface of the substrate 210 may be coated with an insulating material 212, including for example, silicon oxide, to insulate the channel layer 230 from the substrate 210. The insulating material 212 may not be necessary when the substrate 210 includes an insulating material. The channel layer 230 including an ACM is provided on the substrate 210.

The source and drain electrodes 221 and 222 are provided on both sides of the channel layer 230 that includes the ACM such that the source and drain electrodes 221 and 222 are electrically connected to the channel layer 230. The gate insulating layer 240 is provided on the channel layer 230 between the source and drain electrodes 221 and 222. The gate electrode 250 is provided on the gate insulating layer 240.

In the transistor device 200 having the above-described structure, the ACM included in the channel layer 230 may not only function as a channel material, but may also function as a buffer layer for uniformly depositing the gate insulating layer 240, as described above. As described above, an EOT may be reduced by forming the channel layer 230 including the ACM and forming the gate insulating layer 240 on the channel layer 230. Thus, a transistor device 200, which may be operated with a low driving voltage and low driving power, may be manufactured.

Figure 14:
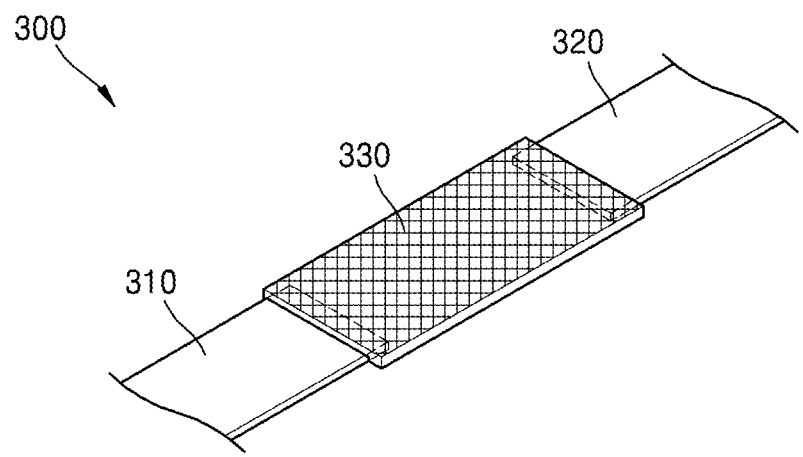
FIG. 14 is a view of a gas sensor according to another exemplary embodiment.

FIG. 14 is a view of a gas sensor 300 according to another exemplary embodiment.

Referring to FIG. 14, the gas sensor 300 may include a first electrode 310 and a second electrode 320 that are spaced apart and an ACM 330 that is provided between the first and second electrodes 310 and 320. As described above, the ACM 330 may be a material layer having a random amorphous structure which is formed from a 2D single carbon atom layer. A certain type of gas, for example, $H_2$ gas or $O_2$ gas, may be adsorbed onto the ACM 330. Therefore, the ACM 330 may function as a gas adsorption plate that adsorbs a certain type of gas in the gas sensor 300. With the above-described structure, when a certain type of gas is adsorbed on the ACM 330, the certain type of gas may be detected via the first and second electrodes 310 and 320.

Further, when electric current is applied through the first and second electrodes 310 and 320 while the certain type of gas is adsorbed onto the ACM 330, the ACM 330 may be heated. In such a manner, the certain type of gas that was adsorbed on the ACM 330 may be removed. For example, when the ACM 330 is heated higher than a predetermined temperature by applying electric current through the first and second electrodes 310 and 320 while $O_2$ gas is adsorbed on the ACM 330, the Van der Waals bond formed between the ACM 330 and $O_2$ gas may break, and thus $O_2$ gas may be removed from the ACM 330.

As described above, in the gas sensor 300 according to the present embodiment, a certain type of gas may be selectively detected by using the ACM 330 as a gas adsorption plate. The gas sensor 300 may be effectively reused by removing the adsorbed gas from the ACM 330 by heating the ACM 330.

FIGS. 15A to 15D are exemplary sectional views of a transparent electrode structure 400 according to another exemplary embodiment.

Figure 15A:
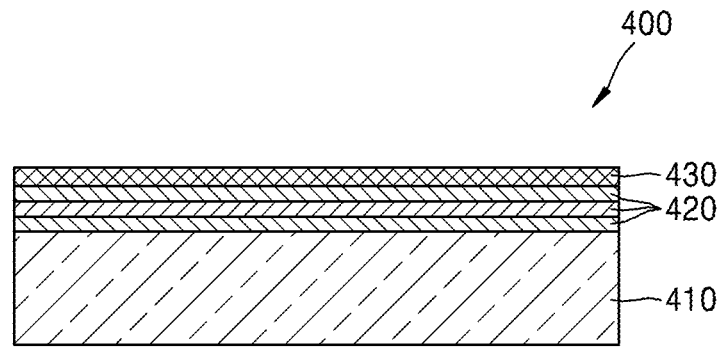
FIGS. 15A to 15D are exemplary sectional views of a transparent electrode structure according to another exemplary embodiment.

Referring to FIG. 15A, the transparent electrode structure 400 may include a substrate 410, and at least one graphene layer 420 and at least one ACM 430 sequentially provided on the substrate 410. Although FIG. 15A shows that three graphene layers 420 are stacked on the substrate 410, this is only an example. Various numbers of graphene layers 420 may be stacked on the substrate 410. Also, although FIG. 15A shows that one ACM 430 is provided on the three graphene layers 420, this is only an example. Various numbers of ACMs 430 may be stacked on the at least one graphene layer 420.

The at least one graphene layer 420 and the at least one ACM 430 sequentially stacked on the substrate 410 may be used as a transparent electrode in, for example, a display device or a touch panel. The transparent electrode, which includes a combination of layers formed by stacking the at least one graphene layer 420 and the at least one ACM 430, may have excellent electric conductivity superior to that of a transparent electrode formed from only a graphene layer. This is because the ACM 430 may be entirely hole-doped, and the hole-doping may provide charges to the graphene layer 420 and thus improve electric conductivity. As described above, a surface of the ACM 430 may have excellent film forming properties. Therefore, different types of material layers, for example, an insulating layer, may be uniformly formed on a surface of the ACM 430 in the transparent electrode structure 400 of FIG. 15A, and thus an electronic device may be effectively manufactured.

Figure 15B:
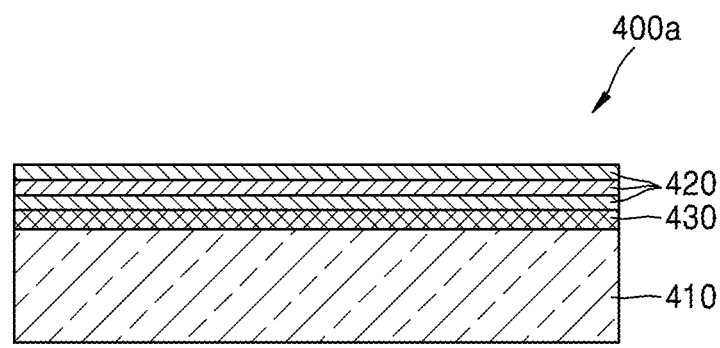

Referring to FIG. 15B, a transparent electrode structure 400a may include the substrate 410 and the at least one ACM 430 and the at least one graphene layer 420 sequentially provided on the substrate 410. Although FIG. 15B shows that one ACM 430 and three graphene layers 420 are stacked on the substrate 410, this is only an example. Various numbers of ACMs 430 and graphene layers 420 may be stacked on the substrate 410. A transparent electrode, which includes a combination of layers formed by stacking the at least one ACM 430 and the at least one graphene layer 420, may have excellent electric conductivity.

Figure 15C:
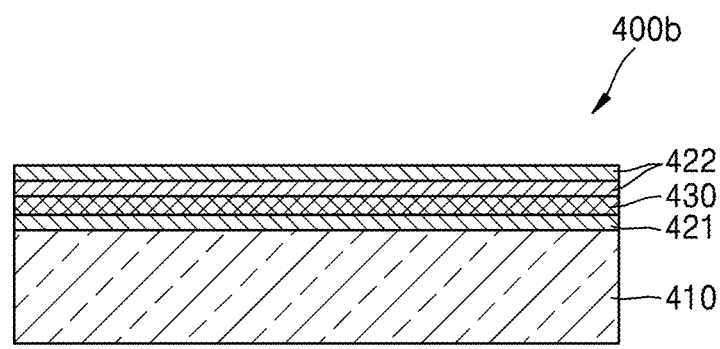

Referring to FIG. 15C, a transparent electrode structure 400b may include the substrate 410 and at least one first graphene layer 421, the at least one ACM 430, and at least one second graphene layer 422 that are sequentially stacked on the substrate 410. Various numbers of first graphene layers 421, ACMs 430, and second graphene layers 422 may be stacked on the substrate 410. A transparent electrode, which includes a combination of layers formed by stacking the at least one first graphene layer 421, the at least one ACM 430, and the at least one second graphene layer 422, may have excellent electric conductivity. Alternatively, although not illustrated in FIG. 15C, a first ACM, a graphene layer, and a second ACM may be sequentially stacked on the substrate 410.

Figure 15D:
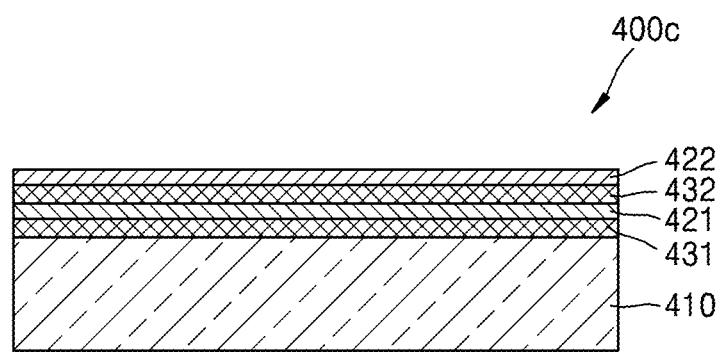

Referring to FIG. 15D, a transparent electrode structure 400c may include the substrate 410 and at least one first ACM 431, the at least one first graphene layer 421, at least one second ACM 432, and the at least one second graphene layer 422 sequentially stacked on the substrate 410. Various numbers of first ACMs 431, first graphene layers 421, second ACMs 432, and second graphene layers 422 may be stacked on the substrate 410. A transparent electrode, which includes a combination of layers formed by stacking the at least one first ACM 431, the at least one first graphene layer 421, the at least one second ACM 432, and the at least one second graphene layer 422, may have excellent electric conductivity. Alternatively, although not illustrated in FIG. 15D, a first graphene layer, a first ACM, a second graphene layer, and a second ACM may be sequentially stacked on the substrate 410.

Figure 16:
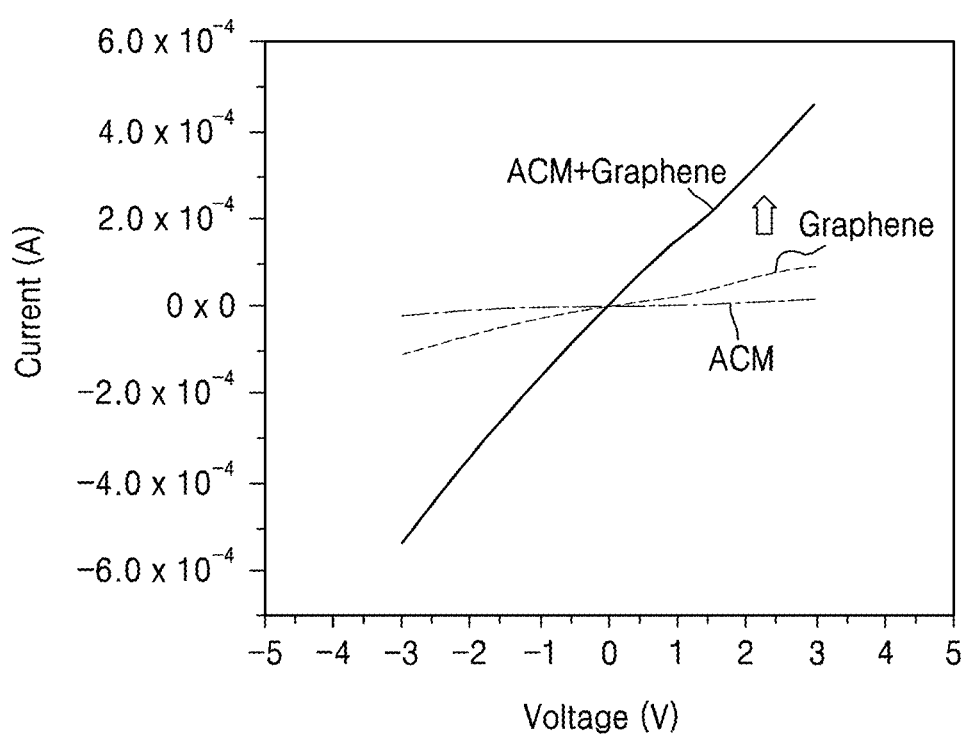
FIG. 16 is a graph showing a comparison of electric conductivities of a graphene layer, an ACM, and a combination layer of a graphene layer and the ACM.

FIG. 16 is a graph showing a comparison of the electric conductivities of a graphene layer, an ACM, and a combination layer including both a graphene layer and an ACM.

Referring to FIG. 16, the electric conductivity of the ACM is lower than that of the graphene layer. However, the electric conductivity of the combination layer, which is formed by stacking the ACM on the graphene layer, is about five times as large as that of the graphene layer alone. In general, electric conductivity may be doubled by stacking two graphene layers. However, when the ACM is stacked on the graphene layer, electric conductivity may be greatly improved as compared to when only the graphene layers are stacked. Therefore, as shown in FIGS. 15A to 15D, a transparent electrode including the combination layer, which is formed by stacking at least one graphene layer and at least one ACM, may have excellent electric conductivity superior to that of a transparent electrode including only the graphene layers.

In the exemplary embodiments above, it has been described that the ACM may be used in a transistor device, a gas sensor, and a transparent electrode. However, the exemplary embodiments are not limited thereto. An ACM may be used in a protection layer protecting a battery electrode, or an electronic device, or other various fields of electronics.

According to the one or more of the above exemplary embodiments, the partial pressure of $H_2$ gas and the ratio of carbon-containing gas to $H_2$ gas may be adjusted during a CVD process so that an ACM having an amorphous structure which is formed from a 2D single carbon atom layer may be formed over an entire surface of a Ge substrate. Also, since the ACM grown as described above is mostly formed from $sp^2$-bonded carbon atoms, like graphene, the ACM may have excellent optical and electric properties. The ACM may be used in a transistor device, and thus may be used to reduce driving voltage and driving power, or may be applied to a gas sensor and adsorb a certain type of gas. In addition, the ACM may be applied to a transparent electrode having excellent electric conductivity. Furthermore, the ACM may be used in a protection layer protecting a battery electrode, or an electronic device, or other various fields of electronics.

It should be understood that the exemplary embodiments described above should be considered to be descriptive only, and do not limit the present disclosure. Descriptions of features or aspects within each exemplary embodiment should typically be considered as being available for other similar features or aspects in other exemplary embodiments.

While one or more exemplary embodiments have been described with reference to the figures, it will be understood by those of ordinary skill in the art that various changes in form and details may be made without departing from the spirit and scope as defined by the following claims.

What is claimed is:

1. A method of forming an amorphous carbon monolayer (ACM), the method comprising forming the ACM on a surface of a germanium (Ge) substrate via chemical vapor deposition (CVD) process,
wherein the CVD process comprises injecting a reaction gas comprising carbon-containing gas and hydrogen ($H_2$) gas into a reaction chamber containing the Ge substrate, and
wherein a partial pressure of the $H_2$ gas in the reaction chamber is in the range of from 1 Torr to 30 Torr,
wherein the ACM is amorphous and is a 2D single carbon atom layer,
wherein a volume ratio of the carbon-containing gas to the $H_2$ gas is at least 0.05, and
wherein a processing temperature in the reaction chamber is in a range of from 850° C. to 937° C.

2. The method of claim 1, wherein a volume ratio of the carbon-containing gas to the $H_2$ gas is at least 0.1.

3. The method of claim 2, wherein the volume ratio of the carbon-containing gas to the $H_2$ gas is at least 0.2.

4. The method of claim 1, wherein inert gas is injected into the reaction chamber in addition to the carbon-containing gas and the $H_2$ gas.

5. The method of claim 1, wherein the Ge substrate is provided on a supporting substrate.

6. The method of claim 5, wherein the supporting substrate comprises a silicon (Si) wafer.

7. The method of claim 5, wherein the supporting substrate comprises $SiO_2$, $Al_2O_3$, GaN, quartz, or Ge oxide.

8. The method of claim 5, wherein the Ge substrate is provided on the supporting substrate by CVD, PVD or wafer bonding.

9. The method of claim 1, wherein in the ACM, a ratio of $sp^3$-bonded carbon atoms to $sp^2$-bonded carbon atoms is 0.2 or less.

10. A method of improving the electrical conductivity of a structure containing a graphene layer on a substrate, the method comprising either (1) forming at least one amorphous carbon monolayer (ACM) between the substrate and the graphene layer; or (2) forming at least one amorphous carbon monolayer (ACM) on the side of the graphene layer furthest from the substrate,
wherein the at least one ACM is amorphous and a 2D single carbon atom layer,
wherein the at least one ACM is formed via chemical vapor deposition (CVD) during which a reaction gas injected into a reaction chamber, and
wherein the reaction gas comprises carbon-containing gas and hydrogen ($H_2$) gas, and a partial pressure of the $H_2$ gas in the reaction chamber is in the range of from 1 Torr to 30 Torr,
wherein a volume ratio of the carbon-containing gas to the $H_2$ gas is at least 0.05, and
wherein a processing temperature in the reaction chamber is in a range of from 850° C. to 937° C.

11. The method of claim 10, wherein a volume ratio of the carbon-containing gas to the $H_2$ gas is at least 0.1.

12. The method of claim 11, wherein the volume ratio of the carbon-containing gas to the $H_2$ gas is at least 0.2.

13. The method of claim 10, wherein inert gas is injected into the reaction chamber in addition to the carbon-containing gas and the $H_2$ gas.

14. The method of claim 10, wherein the substrate is provided on a supporting substrate.

15. The method of claim 14, wherein the supporting substrate comprises a silicon (Si) wafer.

16. The method of claim 14, wherein the supporting substrate comprises $SiO_2$, $Al_2O_3$, GaN, quartz, or Ge oxide.

17. The method of claim 10, wherein in the ACM, a ratio of $sp^3$-bonded carbon atoms to $sp^2$-bonded carbon atoms is 0.2 or less.

* * * * *